Oct. 20, 1970 T. L. STEINHOFF ET AL 3,535,157

METHOD OF COATING PRINTED CIRCUIT BOARD HAVING THROUGH-HOLES

Filed Dec. 18, 1967

Inventors
Thomas L. Steinhoff
Calvin Isaacson
Gerald J. Roelants
by Roberts, Cushman & Grover
Att'ys United States Patent Office 3,535,157
Patented Oct. 20, 1970

3,535,157
METHOD OF COATING PRINTED CIRCUIT BOARD HAVING THROUGH-HOLES

Thomas L. Steinhoff, Dover, and Calvin Isaacson, Beverly, Mass., and Gerald J. Roelants, Richardson, Tex., assignors to Shipley Company, Inc., Newton, Mass., a corporation of Massachusetts Filed Dec. 18, 1967, Ser. No. 691,509
Int. Cl. H05k 3/12
U.S. Cl. 117—212 5 Claims

ABSTRACT OF THE DISCLOSURE

A process for applying a thick coating of a viscous liquid to the surface of a member by roller coating using resilient, grooved or threaded applicator rolls. The process is particularly adapted for producing printed circuit boards of the type comprising a support member in the form of a sheet, panel, or the like fabricated with openings extending therethrough. Composites formed by the process are characterized by the absence of coating material in the openings and coatings of improved thickness and smoothness characteristics.

INTRODUCTION

This invention relates to a process for applying a viscous liquid to the surface of a member optionally provided with openings extending therethrough, and more particularly, to methods useful in the production of printed circuit boards.

BACKGROUND OF THE INVENTION

A common method for the formation of a printed circuit involves the application of a light sensitive material in the form of a viscous liquid solution, to a substrate comprising copper foil bonded to a plastic laminate such as a paper base phenolic. A photographic negative of a circuit pattern is superimposed onto the light sensitive coating, and the composite is exposed to light causing decomposition of the light sensitive material in the light exposed areas to a soluble compound that can be removed by washing, normally with an alkaline solution. Following washing, the exposed copper, in the configuration of a circuit pattern is electroplated with a dissimilar, etch resistant metal such as a lead-nickel alloy. Thereafter, the light sensitive material in the unexposed areas is removed normally with an organic solvent, and the exposed copper removed with an etchant such as a chromic-sulfuric solution.

When both surfaces of a printed circuit board are to be utilized, connections are provided therebetween by means of holes through the substrate, these holes being made conductive by coating the walls thereof with electroless copper prior to application of the light sensitive coating. If, in the process of applying the above viscous light sensitive material to the surface of the circuit board, it enters the through-holes, it will not be reached and decomposed by light upon exposure and consequently, will not be removed by washing with alkali. The electroplated metal coating will not enter and deposit on the copper coated walls of the through-holes and a subsequent etch will remove the light sensitive material and attack the copper coating thereby resulting in a possible break in the connection between surfaces.

A number of satisfactory methods are available for applying a light sensitive coating to a surface readily, easily and inexpensively. However, leaving the relatively small through-holes free of the light sensitive material is a problem, and the practice heretofore has been to apply the coating as a liquid, through a mask or stencil. Not only are such masks or stencils expensive, but they are required to be oriented very precisely with respect to the openings, thereby representing a manufacturing operation which constitutes both an expense and a source of difficulty.

Attempts have been made to apply the light sensitive coating composition by roller coating using smooth, resilient rolls, where a circuit board is provided with through-holes, the light sensitive material is forced into these holes with the resultant, above-noted difficulties. Also, coatings obtained thereby are thin because the smooth rolls do not carry sufficient coating composition and are not continuous due to irregularities in thickness of the substrate.

An improved roller coating process for formation of a circuit board with through-holes is disclosed in U.S. Pat. No. 3,294,576. The process proposed therein comprises applying the coating, in liquid form, using a roll applicator without effort being made to avoid the opening from which the liquid is to be excluded, so that during the course of a coating operation, the applicator extends across and in closing relation in each opening. The liquid is excluded from the opening by passing a gas such as air, through the openings from the opposite sides of the support member and contacting the surface to be coated with a material or element which is porous and does not arrest the flow of air through the openings. The air flowing through the openings prevents the liquid from entering and causes a small area surrounding each opening to be left free of the liquid. Though this method achieves the result described therein, it involves the use of a separate air circulating system and a specially provided porous applicator.

DESCRIPTION OF THE INVENTION

The present invention is predicated upon the discovery that a viscous liquid may be coated onto a flat substrate provided with through-holes in a manner to prevent the entry of liquid into the holes. A roller coating process is used with a roll applicator having a resilient, grooved or threaded surface. The grooves or threads act as a reservoir to hold more coating liquid thereby transferring a greater quantity to the substrate with resultant thicker coatings, i.e., at least 50 millionths of an inch and usually in excess of 100 millionths of an inch with a single pass dependent upon the viscosity of the liquid, groove depth, etc. Compression of the resilient threads under application pressure prevents the viscous liquid from running into the through-holes. Thicker and smoother coatings are formed on substrates both with and without through-holes by the process of this invention. Consequently, the process is broadly applicable to the formation of a thick, smooth coating of a viscous liquid on a flat, planar substrate and is specifically designed for the formation of circuit boards provided with through-holes.

For a fuller understanding of the nature and objects of the invention, reference is made to the accompanying drawings wherein.

Figure 1:
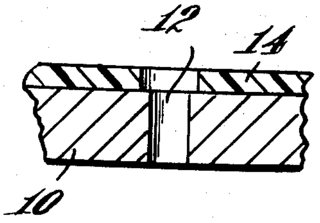
FIG. 1 is a sectional view of a structure produced by the process of the invention.

A typical structure produced by the method of the invention is illustrated in FIG. 1 and comprises a support member 10 which may be formed of a plastic material such as glass reinforced epoxy or phenolic having an opening 12 extending therethrough. This opening may be up to 1/8 inch in diameter and is normally 1/16 inch or less. The support member is provided with a light sensitive coating 14 completely covering one side of member 10 and interrupted only at through-hole 12 and the region immediately surrounding the through-hole to permit electrical contact to be made between surfaces of the support member. The light sensitive coating 14 is a hard layer applied as a viscous liquid and preferably has a composition such as described in U.S. Pats. Nos. 3,046,118; 3,102,809; 3,106,465; 3,130,047; 3,130,048; 3,148,983; 3,061,430; 3,184,310; 3,188,210; 3,201,239 and 3,288,-608; all included herein by reference. A composition particularly adapted to the process of the present invention is described in U.S. patent application Ser. No. 651,700 incorporated herein by reference, and comprises a photosensitizer, preferably a naphthoquinone-(1,2)-diazide sulfonic acid ester; an alkali soluble resin, preferably a novolak resin; a polyvinyl ether; dyes and plasticizers; and solvent.

Figure 2:
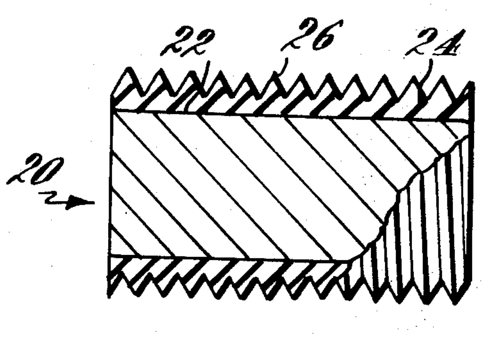
FIG. 2 is a schematic view partially in section illustrating a roll-type applicator in accordance with the invention.

The light sensitive coating is applied to the surface of the structure in the form of a viscous liquid so that it remains in place and does not flow once applied. FIG. 2 illustrates a typical roll applicator 20 in accordance with the invention comprising a hard roll 22 having a resilient covering 24. The resilient covering 24 contains a multiplicity of longitudinal or circumferential corrugations to serve as a reservoir for the coating composition. Preferably, the corrugations are spaced apart or adjacent grooves or threads 26 which may be of any configuration such as a spiral, concentric circles or the like, provided they are compressible and have sufficient volume to serve as a reservoir for the coating composition. In the preferred embodiment, the number of grooves per inch and the depth of the grooves is dependent upon the light sensitive coating composition used, and its viscosity. For compositions such as those of the above noted patents, a 3 to 10″ diameter roll having approximately 40 to 90 threads per inch and an average groove depth of at least 3 and preferably in excess of 5 mils is preferred. It should be understood that these parameters are variable, dependent upon the coating compositions used. Any solid, resilient material can be used as a roll covering, exemplary of which are rubber and the synthetic rubbers such as acrylonitrile rubber, butyl rubber, neoprene, polysulfide rubbers, polybutadiene, etc. Generally, the material used should have a hardness of from 35 to 70 durameters.

Figure 3:
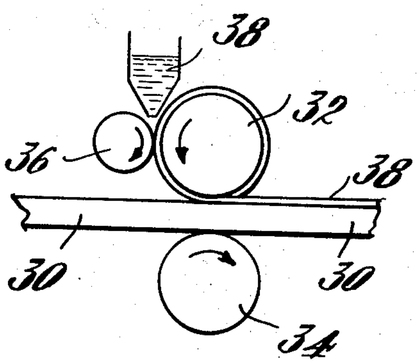
FIGS. 3, 4 and 5 are schematic representations of apparatus for performing the process of the invention.
Figure 4:
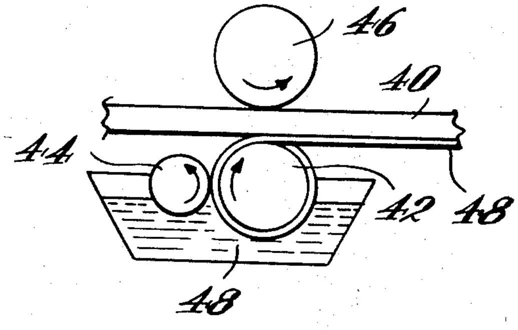
Figure 5:
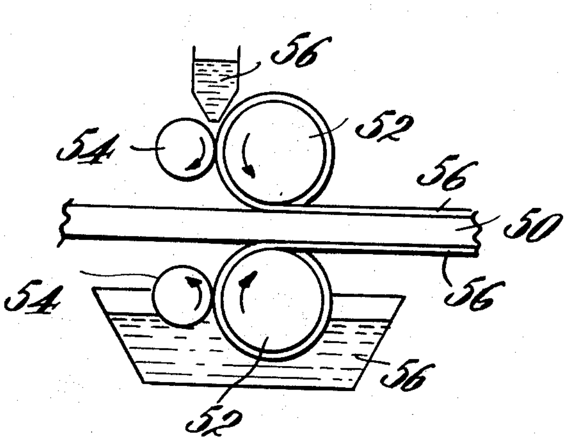

The process of the invention and the apparatus used therefor are schematically represented in FIGS. 3 to 5. With reference to FIG. 3, a flat substrate 30 passes between threaded, resilient applicator roll 32 and support roll 34 at a surface speed preferably of from 3 to 15 ft./min. The support roll 34 may be of a hard material such as metal, but preferably has a resilient covering. The applicator roll and support roll are spaced apart so as to provide an opening somewhat smaller than that of the substrate to cause deformation with partial flattening of the threads. The applicator roll contacts doctor roll 36 to regulate the thickness of the coating composition. A reservoir feeds the viscous light sensitive coating composition 38 to applicator roll 32. A coating of the light sensitive material 38 is formed on the top surface of substrate 30. It dries to a hard, smooth coating. If the substrate has through-holes, they remain open and free of light sensitive material following the coating operation.

The copper clad phenolic and epoxy substrates used for printed circuits are not flat, but contain numerous irregularities in the form of ridges and depressions of a few mils thickness. Using prior art procedures, coatings of the light sensitive material also possess ridges and depressions corresponding to those of the substrate. These irregularities are not evident in coatings formed using the process of the invention. Moreover, the coatings formed are thicker by as much as 300%, a desirable property in the manufacture of printed circuits. Consequently, the process of the invention is broadly applicable to planar substrates with and without through-holes.

FIG. 4 represents a second embodiment of the process of this invention. Substrate 40 passes between grooved, resilient applicator roll 42 in contact with doctor roll 44, and support roll 46. The applicator roll passes through a reservoir containing the light sensitive composition 48 and deposits a coating on the underside of substrate 40.

In FIG. 5, there is represented an embodiment capable of depositing a coating on both surfaces of a substrate. Substrate 50 passes between two resilient, grooved applicator rolls 52, each in contact with doctor roll 54. They pass through reservoirs containing the light sensitive composition 56 and deposit a coating on both surfaces of substrate 50.

The method of the invention makes it possible to apply a viscous liquid coating to a flat substrate that is smoother and thicker than heretofore possible using roller coating procedures. Also, should the substrate contain through-holes, they remain free of the viscous liquid. This is accomplished without the necessity for masks, stencils, equipment with separate air circulating systems and the like, all of which are expensive and difficult to use. The method is easily performed using simple and inexpensive equipment and produces reliable and uniform results.

Inasmuch as various changes may be made in the above process without departing from the scope of the invention herein involved, it is intended that all matter contained in the description or shown in the accompanying drawings shall be interpreted as illustrative and not in a limiting sense. For example, the process is broadly applicable to the applications of a coating of any viscous liquid to any flat substrate and should not be considered limited to the formation of light sensitive coatings in the manufacture of printed circuits.

We claim:

1. In a process for making a printed circuit including the step of applying a light-sensitive coating composition to a substrate having openings extending therethrough, the improvement comprising application of said light-sensitive coating composition to the substrate by charging said light-sensitive composition into the depressions of a roll type applicator having a resilient corrugated outer surface and moving said charged roll type applicator across the surface of said flat member in deformable contact therewith to transfer said coating composition to said flat surface without entry of a coating composition into the openings.

2. The process of claim 1 where the soating composition comprises a naphthoquinone-(1,2)-diazide sulfonic acid ester, an alkali soluble resin, a polyvinyl ether and solvent.

3. The process of claim 2 where the applicator roll has a threaded resilient outer surface of a hardness of from 35 to 70 durometers with at least 40 threads per inch of a depth of at least 3 mils.

4. The process of claim 2 where the applicator roll has a resilient outer surface of a hardness of from 35 to 70 durometers with at least 40 concentric circles per inch of a depth of at least 3 mils.

5. The process of claim 1 where the corrugations are in the form of adjacent, circumferential grooves.

References Cited

UNITED STATES PATENTS

| | | | |
|---|---|---|---|
| 2,051,222 | 8/1936 | Odell | 118—247 |
| 2,241,104 | 5/1941 | Van Der Grinten | 96—49 X |
| 3,042,591 | 7/1962 | Cado | 204—15 |

OTHER REFERENCES

"Evenflo Precision Engraved Rolls" by Pamarco, July 24, 1957.

ALFRED L. LEAVITT, Primary Examiner

A. GRIMALDI, Assistant Examiner

U.S. Cl. X.R.

96—36.1; 117—111